United States Patent [19]

Berkowitz

[11] Patent Number: 5,591,532
[45] Date of Patent: Jan. 7, 1997

[54] GIANT MAGNETORESISTANCE SINGLE FILM ALLOYS

[75] Inventor: Ami Berkowitz, Del Mar, Calif.

[73] Assignee: The Regents of the University of California, Oakland, Calif.

[21] Appl. No.: 221,924

[22] Filed: Apr. 1, 1994

Related U.S. Application Data

[63] Continuation-in-part of Ser. No. 889,431, Jun. 16, 1992, abandoned.

[51] Int. Cl.$^6$ .................................................. B32B 15/00
[52] U.S. Cl. ................................. 428/611; 428/928
[58] Field of Search ......................... 428/611, 680, 428/615, 674, 635, 681, 656, 641, 928; 148/305, 306, 310, 312; 360/113

[56] References Cited

U.S. PATENT DOCUMENTS

| | | | |
|---|---|---|---|
| 4,585,473 | 4/1986 | Narasimhan et al. | 75/0.5 C |
| 5,186,854 | 2/1993 | Edelstein | 252/62.55 |
| 5,268,043 | 12/1993 | McCowen | 148/310 |
| 5,315,468 | 5/1994 | Lin et al. | 360/113 |
| 5,373,238 | 12/1994 | McGuire et al. | 324/252 |

FOREIGN PATENT DOCUMENTS 0271657  6/1988  European Pat. Off. .

OTHER PUBLICATIONS

Berkowitz et al. "Thermomagnetic behavior of a duplex ferromagnetic alloy of $Fe_{15}Si_{15}B_{10}$", J. Appld Phys, 50(3), Mar. 1979, pp. 1754–1756.
*Granular Cobalt in a Metallic Matrix* by J. R. Childress and C. L. Chien; J. Appl. Phys. 70 (10), 15 Nov. 1991 pp. 5885–5887.
*Magnetic Properties Of $FE_xCU_{100-x}$ Solid Solutions* by C. L. Chien et al.; Physical Review B, vol. 33, No. 5, 1 Mar., 1986, pp. 3247–3250.
*Reentrant Magnetic Behavior In FCC CO–CU Alloys* by J. R. Childress and C. L. Chien; Physical Review B, vol. 43, No. 10, 1 Apr.,1991, pp. 8089–8093.
*Granular FE In A Metallic Matrix* by J. R. Childress and C. L. Chien; Appl. Phys. Lett. 56(1), 1 Jan. 1990, pp. 95–97.
*Composition Range Of Binary Amorphous Alloys* by S. H. Liou and C. L. Chien; Physical Review B, vol. 35, No. 5, 15 Feb., 1987–I, pp. 2443–2446.
*Magnetic Moment Of CO–CU Solid Solutions With 40 To 85 CU* by E. Kneller; Journal of Applied Physics, Supplement to vol. 33, No. 3, Mar., 1962 pp. 1355–1356.
*Magnetic And Structural Properties Of Metastable FE–CU Solid Solutions* by E. F. Kneller; Journal of Applied Physics, vol. 35, No. 7, Jul., 1964, pp. 2210–2211.

*Primary Examiner*—Robert A. Dawson
*Assistant Examiner*—Linda L. Gray
*Attorney, Agent, or Firm*—Brown, Martin, Haller & McClain

[57] ABSTRACT

A single layer film is deposited onto a substrate at room temperature from two sources, one source being a magnetic material, the other being a less-magnetic material. The film is annealed for predetermined times in order to induce phase separation between the magnetic clusters and the less-magnetic matrix, and to form stable clusters of a size such that each magnetic particle, or cluster, comprises a single domain and has no dimensions greater than the electron spin flip mean free path within the particle. The creation of two magnetic phases makes it possible to establish exchange coupling between the phases so that a relatively low saturation field is required to induce GMR.

10 Claims, 1 Drawing Sheet

GIANT MAGNETORESISTANCE SINGLE FILM ALLOYS

This invention was made with Government support under Grant No. NSF-90-10908, awarded by the National Institute Science Foundation. The Government has certain rights in this invention.

This is a continuation-in-part of co-pending application Ser. No. 07/889,431, filed Jun. 16, 1992, now abandoned.

BACKGROUND OF THE INVENTION

The drive towards higher density data storage on magnetic media has imposed a significant demand on the size and sensitivity of magnetic heads. This demand has been met, in part, by thin film inductive and magnetoresistive heads which can be fabricated in very small sizes by deposition and lithographic techniques similar to those used in the semiconductor industry. Thin film inductive heads are subject to the same problems as their core-and-winding predecessors of extreme sensitivity to gap irregularities and stray fields which result in output signal losses. Thin film magnetoresistive heads, on the other hand, rely on changes in the material's resistance in response to flux from the recording media, providing advantages of decreased sensitivity to speed of the recording media and higher density data capability. For these reasons, inter alia, magnetoresistive elements are increasingly preferred over inductive heads for reading data stored at high densities on magnetic media.

A figure of merit for magnetoresistive (MR) elements is $\Delta R/R$, which is the percent change in resistance of the element as the magnetization changes from parallel to perpendicular to the direction of the current. In the present technology, magnetoresistive elements are made from permalloy (81% Ni/19% Fe), which, at room temperature has a $\Delta R/R$ of about 3%. For improved response and higher density data recording, a higher value of $\Delta R/R$ is desirable.

In 1988 is was discovered that certain magnetic layered structures with anti-ferromagnetic couplings exhibit a phenomenon called "giant magnetoresistance" ("GMR") for which, in the presence of a magnetic field, $\Delta R/R$ can be as high as 50%. The GMR phenomenon is derived from the reorientation of the magnetization in successive layers from antiparallel to parallel. This is distinctly different from anisotropic MR which depends on the relative directions of the magnetization and the measuring current. For optimum properties, the thickness of the multilayers must be less than 3 nm, and $\Delta R/R$ increases with the number of pairs of thin film layers. Thus, these multilayers provide significant challenges for production because of the precision with which the thicknesses and other features, such as interface roughness, must be maintained for the many iterations of the pairs of magnetic and non-magnetic films. Several studies have shown that GMR oscillates in magnitude as a function of the thickness of the non-magnetic layers, increasing the concern about thickness control. These layered structures are also subject to output noise from magnetic domains, and, since their outputs are nonlinear, the devices must be biased to obtain a linear output. Most reported work has been on Fe/Cr superlattices, however, Co/Cr, Co/Cu and Co/Ru superlattices have also been found to exhibit GMR.

The extreme sensitivity to layer thickness places significant limitations on practical and economical application of GMR to data recording and other potential uses. Another significant obstacle to the practical application of GMR, such as in high density magnetic storage, is that the dramatic changes in resistance require relatively high magnetic fields to trigger the change, on the order of 250 Oersteds or more. These fields are too high for magnetic data storage, for which the saturation fields must be less than about 100 Oe.

An alternative to the multilayer structure of alternating magnetic and non-magnetic layers is the formation of magnetic particles in a non-magnetic matrix. One reported method for creating such a structure is to deposit alternating layers of magnetic and non-magnetic materials, then anneal the film to break up the layers into "islands" of magnetic material within a non-magnetic "sea". While this process may relieve some of the obstacles relating to extreme precision thickness requirements, the problem remains that very high magnetic fields are required to induce GMR.

The requirement of high magnetic field strength to achieve GMR results from, among other things, the magnetic anisotropy of the individual particles of magnetic material. If the particles have large shape anisotropy, or they are under high stress, they will be difficult to saturate. One approach to overcome this limitation is to use a magnetic material which forms spherical particles, i.e., decreased shape anisotropy. However, sufficiently low saturation fields to meet the needs of magnetic recording have not yet been attained.

SUMMARY OF THE INVENTION

It is an object of the present invention to provide heterogeneous alloys which exhibit giant magnetoresistance without requiring excessive saturation fields.

It is a further object of the present invention to provide a method for forming such alloys.

In the preferred embodiment, a single layer film is sputtered onto a substrate at room temperature from separate targets, one target being a ferromagnetic material, the other being a magnetic material of lesser magnetism. The film is annealed for a predetermined time in order to induce phase separation between the magnetic clusters and the less-magnetic matrix so that two separate magnetic phases are formed. The annealing step forms stable clusters of a size such that each magnetic particle, or cluster, comprises a single domain and has no dimension greater than the mean electron spin flip path within the particle. The matrix is just magnetic enough to establish a degree of exchange interaction among the magnetic particles. Thus, magnetic scattering can occur by simply moving from one magnetic phase to another when the film is exposed to a change in the direction of magnetization. However, the difference in magnetism between the material of which the particles are formed and the matrix material is large enough to avoid the formation of large domains from too much exchange coupling.

Other deposition and film-forming techniques may be used including sputtering from a single composite target, evaporation, metal pastes, mechanically combining the magnetic and less-magnetic materials or implanting the magnetic materials (ions) into the less-magnetic matrix.

While a distinct interface needs to be maintained between the magnetic and less-magnetic components of the film, the film can be formed from materials which are either immiscible or miscible under equilibrium conditions. In the latter case, deposition conditions can be controlled to assure that the desired separation is maintained between the magnetic and less-magnetic components of the film.

BRIEF DESCRIPTION OF THE DRAWINGS

Understanding of the present invention will be facilitated by consideration of the following detailed description of a preferred embodiment of the present invention, taken in conjunction with the accompanying drawings, in which like reference numerals refer to like parts and in which.

DETAILED DESCRIPTION OF THE PREFERRED EMBODIMENT

Figure 1:
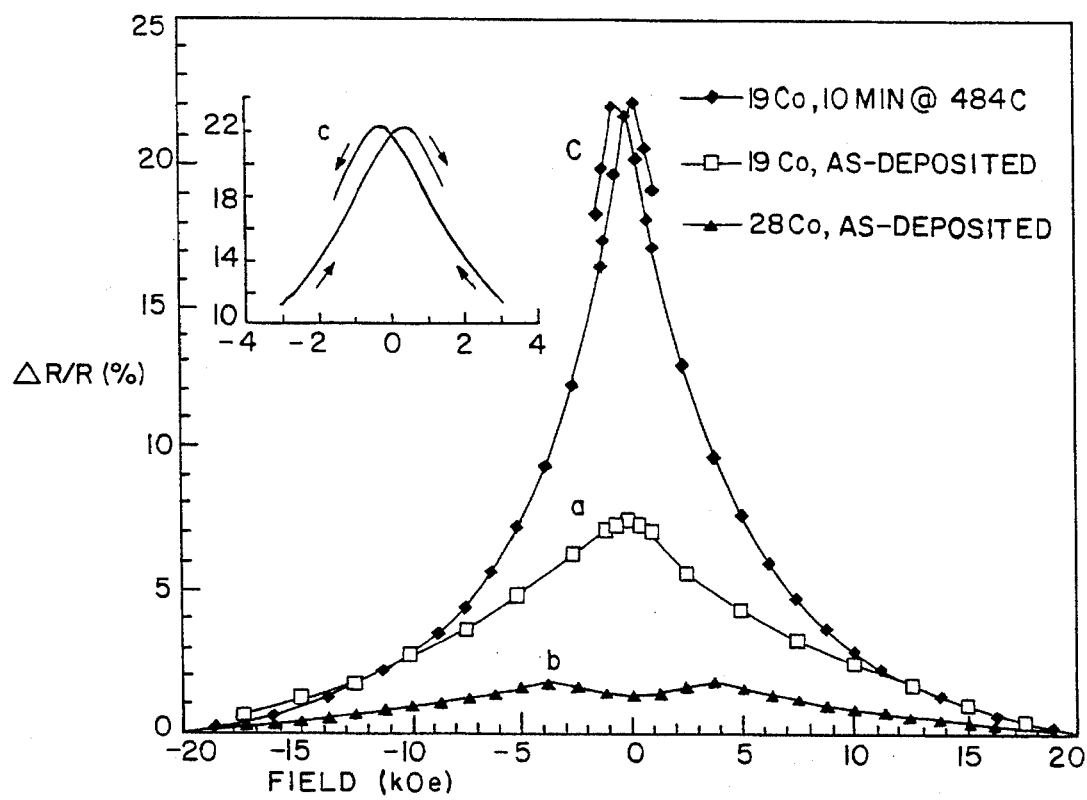
FIG. 1 is a plot of resistance ratio with applied magnetic fields for an exemplary film.

A single layer film comprising a magnetic material and a magnetic material of comparatively lesser magnetism (hereinafter identified as "less-magnetic") is deposited on a substrate by d.c. magnetron co-sputtering from separate targets. The sputter deposition is performed at low pressures, in the $10^{-7}$ torr range. The film is formed with the less-magnetic film providing a matrix within which magnetic particles or clusters are precipitated. After deposition, the sample may be annealed to control the size of the particles. The ideal particles must be large enough to avoid superparamagnetism (thermally-activated magnetization reversal at room temperature), but small enough that their dimensions do not exceed the mean free path within the particles, and so that they remain a single magnetic domain. In an actual sample there will be some variation in particle size within a given film, with some particles smaller than, and others larger than, the "ideal". The average particle size in such a sample should possess the desired relationships to domain and mean free path.

A number of other deposition or film-forming techniques may also be used, including evaporation, pastes or mechanically-formed metals, e.g., heated and compressed by high pressure rollers. Magnetic materials may also be implanted into a less-magnetic matrix or may be deposited as alternating layers of magnetic and less-magnetic material and then annealed. Any of these or similar techniques can then be followed by heat processing to assure formation of the desired magnetic precipitates.

By precipitating small magnetic particles in a less-magnetic matrix, an increased surface area of magnetic material is made available for the electron scattering that is responsible for giant magnetoresistance (GMR). This dependence upon available surface area indicates that the magnetic and less-magnetic materials must remain separate with distinguishable interfaces between the different magnetic phases. This requirement follows the explanations of GMR in multilayered structures that the electrons are scattered at the interfaces, where spin dependent scattering predominates in comparison to bulk scattering. The need for distinct interfaces between the magnetic and less-magnetic materials does not, however, limit the choice of materials to those that are mutually insoluble, nor does it preclude the occurrence of magnetic coupling between the two magnetic phases. (In fact, a degree of magnetic coupling between the two phases is necessary to enable the use of lower fields to induce GMR.) While the materials can be immiscible under equilibrium conditions, they can also be miscible, with the materials being kept separate by controlling deposition conditions.

In the preferred embodiment, the less-magnetic matrix material serves to establish a degree of exchange interactions among the magnetic particles. This produces a significantly lower saturation field than that which would be obtained when the magnetic particles are not exchange coupled, as in the case of a non-magnetic matrix. This occurs when the particles are smaller than the "exchange length", which is essentially the length over which exchange energy constrains a group of exchange-coupled particles to have a single direction of magnetization. Thus, by introducing a degree of exchange coupling among the particles, the intrinsic anisoptropies are averaged out, thereby reducing the saturation field significantly. This is the principle behind the current FINEMET materials which are being examined as "soft" magnetic materials. These materials consist of particles of nominally anisotropic magnetic materials which are exchange coupled to each other with the result that the intrinsic particle anisoptropies are averaged out and a very soft magnetic material results. (The FINEMET materials are formed from an amorphous multi-element ribbon, e.g., Fe, Co, which is then annealed to create crystalline precipitates coupled to each other through grain boundaries by direct magnetic exchange interaction.)

The present invention of magnetic particles in a less-magnetic matrix must avoid too strong an exchange interaction which may cause large domains to be formed. The formation of large domains will prevent the desired situation in which the magnetic particles are randomly magnetized. Thus, while some exchange coupling is needed to provide the exchange interactions, it must not be so strong as to form large domains. Exchange coupling can be adjusted by choice of materials, and it may also be possible to achieve the desired coupling by means of magnetostatic (dipolar) coupling among the particles. In other words, the particles would not be exchange coupled, but they would be close enough so that their dipolar fields are significant.

An additional advantage of a film consisting of magnetic particles within a less-magnetic matrix is that they can be biased by exchange coupling to antiferromagnetic films such as CoO—NiO alloys. This possibility exists because both phases, i.e., particles and matrix, in the film are magnetic. The ability to bias these films provides a number of advantages including: 1) minimization of domain wall motion (the domain walls are "pinned"), thus reducing noise in device applications; and 2) linearization of a magnetic head's output signal.

Suitable materials for creation of the film consisting of magnetic particles within a less-magnetic matrix include the two phase system $Fe_2B$—Fe—Si, which is disclosed in two articles co-authored by the present inventor: "Thermomagnetic Behavior of a Duplex Ferromagnetic Alloy", A. E. Berkowitz, J. D. Livingston, B. D. Nathan, and J. L. Walter, *J. Appl. Phys.*, 50, 1754 (1979), and "Magnetostatic Interactions in a Duplex Ferromagnetic Alloy", J. D. Livingston, A. E. Berkowitz, and J. L. Walter, *IEEE Trans. Magn.*, 15, 1295 (1979). In the disclosed duplex alloy, $Fe_2B$ (a "hard" magnetic material) precipitates form in a less-magnetic matrix of Fe—Si (a "soft" magnetic material). The relative amounts of the two phases can be controlled by adjusting the ratios of Fe/Si/B.

Another suitable material for the single film alloy of the preferred embodiment is Fe—Ni—Cu, which produces FeNi particles in a Ni—Cu matrix. The magnetism of the Ni—Cu matrix can be adjusted by varying the Cu/Ni ratio. Similarly, a Co—Ni—Cu alloy can be used. The desired degree of exchange coupling can be controlled in Ni—Fe or Co—Fe alloys by including small amounts of Cu, on the order of 1%. In this case, the Cu segregates at the grain boundaries, thereby reducing the exchange coupling.

In initial evaluations of magnetic particles in a non-magnetic matrix to demonstrate the general efficacy of the deposition and annealing steps in forming suspension of magnetic particles in a less-magnetic matrix, cobalt-copper (Co—Cu) films were prepared by d.c. magnetron sputtering from separate copper and cobalt targets onto a silicon wafer having <100> orientation. A 3.5 minute pre-sputter step was performed prior to deposition. The background pressure was $6\times10^{-7}$ torr. The deposition takes approximately 100 minutes at room temperature with the substrates rotated above the targets at one revolution per second provided a 3,000 Å film.

Sputter rates were adjusted to yield films of 12, 19 and 28 atom percent cobalt. These samples exhibited GMR at 10K with MR negligible at room temperature, indicating a superparamagnetic behavior due to a highly disordered state and fine grain size. The samples were annealed to increase grain size, to achieve phase separation between cobalt and copper, and to form stable cobalt particles. After annealing, the 19 Co and the 28 Co samples show the largest GMR changes. Their MR curves had the shape shown in line C of FIG. 1. The maximum GMR occurred at a coercive force, $H_c$, which was approximately 500 Oe at 10° K. for all annealed 19 Co and 28 Co samples. Remanence/saturation ($M_r/M_s$) ratios were greater than 0.3 at 10° K. for all annealed samples. Both $H_c$ and $M_r/M_s$ decreased with increased measurement temperature and annealing time. The magnetic behavior of the annealed samples was associated with the precipitation of cobalt-rich particles in a copper-rich matrix.

Figure 2:
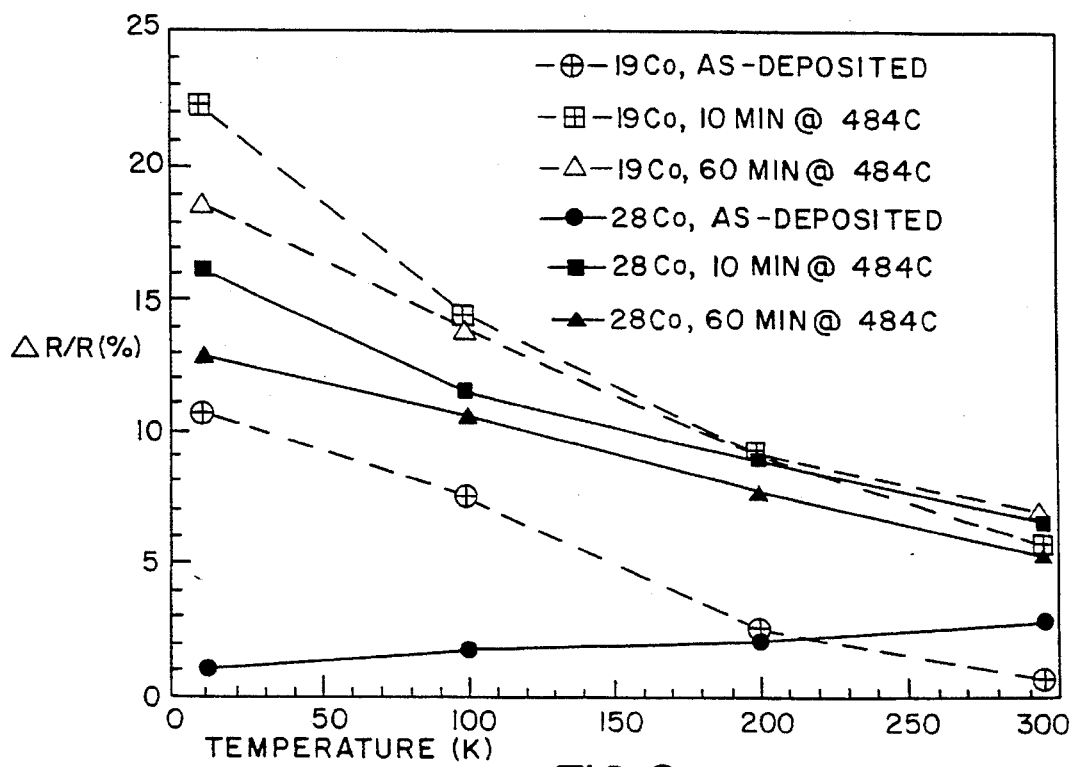
FIG. 2 is a plot of resistance ratio with temperature for the exemplary film.

FIG. 2 shows $\Delta R/R$ versus temperature for as-deposited and annealed 19 Co and 28 Co specimens. Saturation fields for the GMR coincided with the saturation fields for magnetization. The resistance change increased with increasing annealing temperature and time (except for the as-deposited 28 Co).

As annealing times and temperatures increase, the average Co-rich particle sizes also increase, with corresponding decrease in GMR. Larger Co particles have several adverse effects on GMR: 1) the surface/volume ratio decreases, reducing the spin-dependent interfacial scattering relative to bulk-scattering processes; 2) the particles become larger than the mean-free path within the particles; and 3) the particles are no longer single domains such that the interaction of the conduction electron spins with the varying magnetization distribution in the particles produces a state in which the conduction electron spin channels are mixed. Also seen in FIG. 2 is the rapid relaxation rate of GMR with increasing temperature, which is attributable to superparamagnetism.

The GMR in the heterogeneous copper-cobalt alloys may be analyzed in the same manner as the copper-cobalt multilayers. Assuming a random distribution of cobalt particles with average radius $r_{co}$ in a copper matrix, and adopting a spin-dependent scattering model at the surfaces of the cobalt particles and within the cobalt particles, the conductivity can be written as:

$$\sigma = \frac{ne^2}{2m} \sum_\sigma \frac{1}{\Delta^\sigma} \tag{1}$$

where n is the number of electrons, e is the electron charge, m is the electron mass, and $\Delta^\sigma$ is the average scattering matrix. The phenomenological input for $\Delta^\sigma$ is:

$$\Delta^\sigma = \Delta_{Cu} + \Delta_{Co}^\sigma + \Delta_s^\sigma \tag{2}$$

where $$\Delta_{Cu} \propto \frac{1-C}{\lambda_{Cu}},$$

$$\Delta_{Co}^\sigma \propto \frac{C}{\lambda_{Co}} (1 + p_{Co}^2 + 2p_{Co}\hat{\sigma}\cdot\hat{M}_{Co}),$$

$$\Delta_s^\sigma \propto \frac{3C\xi}{r_{Co}} (1 + p_s^2 + 2p_s\hat{\sigma}\cdot\hat{M}_{Co}),$$

and and C is the Co concentration; $\lambda_{cu}$ and $\lambda_{Co}$ are the mean free paths of Cu and Co, respectively; $\xi$ is the scattering strength for surfaces; $p_{Co}$ and $p_S$ are the spin dependent ratios for scattering within the Co particles and at their surfaces, respectively. Thus, Equation (1) is the sum of scattering in Cu, Co, and at the interfaces between them. Since $$GMR = \frac{\sigma(H=H_S) - \sigma(H=H_C)}{\sigma(H=H_C)} \tag{3}$$

Equation (2) is substituted into Equation (1), and Equation (3) becomes:

$$GMR = \frac{\sigma^\uparrow(H=H_S) + \sigma^\downarrow(H=H_S) - 2\sigma(H=H_C)}{2\sigma(H=H_C)} \tag{4}$$

where $$\sigma^{\uparrow\downarrow}(H=H_S) = \left[ \frac{1-C}{\lambda_{Cu}} + \frac{C}{\lambda_{Co}}(1+p_{Co}^2) + \frac{3C\xi}{r_{Co}}(1\pm p_S)^2 \right]^{-1}$$

with ± referring to spin up and down, and $$\sigma(H=H_C) = \left[ \frac{1-C}{\lambda_{Cu}} + \frac{C}{\lambda_{Co}}(1+p_{Co}^2) + \frac{3C\xi}{r_{Co}}(1+p_S^2) \right]^{-1}.$$

In Co/Cu multilayers, the principal spin dependent scattering is from the interfacial term ($p_s=0.5$ $p_{Co}=0.2$, $\xi=0.3$) [16]. Thus, if $p_{Co}=0$, Equation (4) reduces to $$GMR \approx \frac{4p_s^2}{(1-p_s^2)^2 + 2\sigma(1+p_s^2)r_{Co} + \sigma^2 r_{Co}^2}, \tag{5}$$

where $$\sigma = \left( \frac{1-C}{\lambda_{Cu}} + \frac{C}{\lambda_{Co}} \right)/3C\xi \tag{6}$$

Equation (5) correctly predicts the inverse dependence of GMR on the particle size, in accordance with the surface/volume ratio consideration noted above.

A consideration in the development of magnetoresistive films for practical applications is that the applied saturation field be as low as possible while still achieving the maximum $\Delta R/R$. It is well known that soft ferromagnetic materials provide greater MR with lower applied fields. Materials which may be used as softer magnetic particles include those which are well known in the recording industry for their use in inductive heads, including iron, cobalt-iron, and permalloy.

Another factor which will influence the efficiency of the saturation field in inducing giant magnetoresistance is the shape of the magnetic particles. A demagnetizing field will be generated by a spherical particle such that an additional field must be overcome by the applied saturation field. By controlling the shape of the particles during deposition, disc-like particles can be formed which possess lower demagnetization fields while still having large surface areas. Preferably, the plane of the disc-like particles will be oriented parallel to the field. Such an effect can be achieved by control of deposition parameters or by post-deposition anneal under a magnetic field.

For practical applications, a robust material such as silver may be desirable for use as a non-magnetic matrix. Cobalt and silver are immiscible under equilibrium conditions. After annealing one hour at 200° C., the ΔR/R at room temperature for a sample of 33 atom-% Co in silver was measured at 21.5%. An advantage of using silver is its relatively high environmental stability, i.e., minimal corrosion or oxidation, and such an alloy system is much easier to prepare and control than multilayers. Silver is further suited for use in such an application because none of the magnetic elements are soluble in silver. Other possible matrix materials include ruthenium, gold and chromium, among others. It is also desirable to supplement or substitute the cobalt, which is a hard magnetic material, with softer magnetic materials.

In other testing, measurements on four film samples of ternary alloy CuNiCo were performed at room temperature in fields H≤20 kOe. Following growth by sputtering onto thermally oxidized silicon substrates, the 100–200 nm thick films were annealed between 1 and 6 hours at temperatures $T_A$=200, 350, 500 and 700° C. The samples displayed large anisotropic magnetoresistances (AMR), associated with normal magnetoresistance, at H<100 Oe of up to 8% at room temperature for Cu(13)Ni(41)Co(46) (vol %) for the sample annealed at 350° C. Despite the fact that in the bulk these alloys tend to phase separate into Co rich and Co poor regions, evidence for GMR (isotropic magnetoresistance) was found in only one sample, Cu(20)Ni(53)Co(27) (vol %), after a 6 hour anneal at 700° C. In the as-deposited condition, samples Cu(20)Ni(53)Co(27) (vol %) and Cu(13)Ni(41)Co(46) (vol %) display a pronounced asymmetry between the resistance decrease for H perpendicular to the current I and the corresponding increase for H parallel to I which substantially exceeds the 1:2 ratio in bulk materials or the 1:1 ratio expected for a thin film. The large observed values of AMR, which was more evident in samples with low Cu concentrations, are likely linked to AMR in binary CuCo alloys, which are known to exhibit large AMR.

The above-described method eliminates the need for use of multilayers for achieving giant magnetoresistance. The single layer film of the present invention possesses several advantages over the prior GMR materials in that it is easier to control fabrication, its output may be linear, and domain wall motion can be controlled by pinning the walls so that noise is significantly reduced. It is anticipated that the inventive film will significantly enhance the fabrication of magnetoresistive heads, making such films more practical and economical than those of the current technology.

It will be evident that there are additional embodiments which are not illustrated above but which are clearly within the scope and spirit of the present invention. The above description and drawings are therefore intended to be exemplary only and the scope of the invention is to be limited solely by the appended claims.

I claim:

1. A single layer film which exhibits giant magnetoresistance upon application of a magnetic field of about 100 Oersted or less, the film comprising:

a magnetic metallic matrix on a substrate, said magnetic metallic matrix having a first magnetic phase;

a plurality of magnet particles having a second magnetic phase of greater magnetism than said first magnetic phase suspended within said magnetic metallic matrix wherein each magnetic particle comprises a single magnetic domain having a size less than a mean free path within said magnetic particle and such that an amount of spin-dependent interfacial scattering from an outer surface of said magnetic particles is increased relative to an amount of bulk scattering within said magnetic particles to increase giant magnetoresistance in accordance with the relationship $$MR \approx \frac{4p_s^2}{(1-p_s^2)^2 + 2\sigma(1+p_s^2)r_{MR} + \sigma^2 r_{MR}^2},$$

where $$\sigma = \left( \frac{1-c}{\lambda_{MX}} + \frac{c}{\lambda_{MR}} \right)/3c\xi$$

and $r_{MR}$ is an average radius of said magnetic particles, $p_S$ is a spin-dependent ratio for scattering at a surface of said magnetic particles, $\lambda_{MX}$ is a mean free path in said magnetic metallic matrix, $\lambda_{MR}$ is a mean free path in said magnetic particles, $\xi$ is a scattering strength for said surface of said magnetic particles, and c is a concentration of said magnetic particles; and a biasing means comprising an antiferromagnetic film which is exchange coupled with said magnetic metallic matrix;

wherein exchange coupling is established between said first magnetic phase and said second magnetic phase.

2. A single layer film as in claim 1 wherein said magnetic particles are Fe$_2$B.

3. A single layer film as in claim 1 wherein said magnetic particles are FeNi.

4. A single layer film as in claim 1 wherein said magnetic metallic matrix is FeSi.

5. A single layer film as in claim 3 wherein said magnetic metallic matrix is NiCu.

6. A single layer film which exhibits giant magnetoresistance upon application of a magnetic field of about 100 Oersted or less, the film comprising:

a magnetic metallic matrix on a substrate, said magnetic metallic matrix, said metallic matrix being NiCu and having a first magnetic phase; and a plurality of magnetic particles having a second magnetic phase of greater magnetism than said first magnetic phase suspended within said magnetic metallic matrix wherein each magnetic particle comprises a single magnetic domain having a size less than a mean free path within said magnetic particle and such that an amount of spin-dependent interfacial scattering from an outer surface of said magnetic particles is increased relative to an amount of bulk scattering within said magnetic particles to increase giant magnetoresistance in accordance with the relationship $$MR \approx \frac{4p_s^2}{(1-p_s^2)^2 + 2\sigma(1+p_s^2)r_{MR} + \sigma^2 r_{MR}^2},$$

where $$\sigma = \left( \frac{1-C}{\lambda_{MX}} + \frac{C}{\lambda_{MR}} \right)/3C\xi$$

and $r_{MR}$ is an average radius of said magnetic particles, $p_S$ is a spin-dependent ratio for scattering at a surface of said magnetic particles, $\lambda_{MX}$ is a mean free path in said magnetic metallic matrix, $\lambda_{MR}$ is a mean free path in said magnetic particles, $\xi$ is a scattering strength for said surface of said magnetic particles, and c is a concentration of said magnetic particles;

wherein exchange coupling is established between said first magnetic phase and said second magnetic phase.

7. A heterogeneous film having giant magnetoresistive response to an applied magnetic field of about 100 Oersted or less comprising:

a plurality of magnetic particles;

a matrix comprising a metallic material having a second magnetism less than a first magnetism of said magnetic particles, said plurality of magnetic particles being suspended within said matrix, said matrix being insoluble with said magnetic particles; and a biasing means comprising an antiferromagnetic material which is exchange coupled with said matrix;

wherein each of said plurality of magnetic particles has a size which is less than a mean free path within each said magnetic particle and said size is such that an amount of spin-dependent interfacial scattering from an outer surface of said magnetic particles is increased relative to an amount of bulk scattering within said magnetic particles to increase giant magnetoresistance in accordance with the relationship $$MR \approx \frac{4p_s^2}{(1-p_s^2)^2 + 2\sigma(1+p_s^2)r_{MR} + \sigma^2 r_{MR}^2},$$

where $$\sigma = \left( \frac{1-C}{\lambda_{MX}} + \frac{C}{\lambda_{MR}} \right) /3C\xi$$

and $r_{MR}$ is an average radius of said magnetic particles, $p_S$ is a spin-dependent ratio for scattering at a surface of said magnetic particles, $\lambda_{MX}$ is a mean free path in said matrix, $\lambda_{MR}$ is a mean free path in said magnetic particles, $\xi$ is a scattering strength for said surface of said magnetic particles, and c is a concentration of said magnetic particles.

8. A heterogeneous film as in claim 7 wherein each magnetic particle comprises a single magnetic domain.

9. A heterogeneous film as in claim 7 wherein said size of each magnetic particle is such that an interfacial scattering of electrons from an interface between said magnetic particles and said matrix is greater than a bulk scattering of electrons within said magnetic particles.

10. A single layer film which exhibits giant magnetoresistance upon application of a magnetic field of about 100 Oersted or less, the film comprising:

a magnetic metallic matrix on a substrate, said magnetic metallic matrix having a first magnetic phase; and a plurality of magnetic particles, said magnetic particles being FeNi and having a second magnetic phase of greater magnetism than said first magnetic phase suspended within said magnetic metallic matrix wherein each magnetic particle comprises a single magnetic domain having a size less than a mean free path within said magnetic particle and such that an amount of spin-dependent interfacial scattering from an outer surface of said magnetic particles is increased relative to an amount of bulk scattering within said magnetic particles to increase giant magnetoresistance in accordance with the relationship $$MR \approx \frac{4p_s^2}{(1-p_s^2)^2 + 2\sigma(1+p_s^2)r_{MR} + \sigma^2 r_{MR}^2},$$

where $$\sigma = \left( \frac{1-C}{\lambda_{MX}} + \frac{C}{\lambda_{MR}} \right) /3C\xi$$

and $r_{MR}$ is an average radius of said magnetic particles, $p_S$ is a spin-dependent ratio for scattering at a surface of said magnetic particles, $\lambda_{MX}$ is a mean free path in said magnetic metallic matrix, $\lambda_{MR}$ is a mean free path in said magnetic particles, $\xi$ is a scattering strength for said surface of said magnetic particles, and c is a concentration of said magnetic particles;

wherein exchange coupling is established between said first magnetic phase and said second magnetic phase.

* * * * *

UNITED STATES PATENT AND TRADEMARK OFFICE
CERTIFICATE OF CORRECTION

PATENT NO. : 5,591,532
DATED : January 7, 1997
INVENTOR(S) : AMI BERKOWITZ

It is certified that error appears in the above-indentified patent and that said Letters Patent is hereby corrected as shown below:

- COLUMN 7, CLAIM 1, LINE 60, REPLACE "MAGNET" WITH --MAGNETIC--.

Signed and Sealed this

Sixteenth Day of December, 1997

*Attest:*

BRUCE LEHMAN

*Attesting Officer*      *Commissioner of Patents and Trademarks*